US011598508B2

(12) United States Patent
Niki et al.

(10) Patent No.: US 11,598,508 B2
(45) Date of Patent: Mar. 7, 2023

(54) LIGHT EMITTING DEVICE

(71) Applicant: NICHIA CORPORATION, Anan (JP)

(72) Inventors: Kenta Niki, Tokushima (JP); Jun Takahashi, Inagi (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/305,124

(22) Filed: Jun. 30, 2021

(65) Prior Publication Data

US 2021/0404632 A1 Dec. 30, 2021

(30) Foreign Application Priority Data

Jun. 30, 2020 (JP) .............................. JP2020-113376

(51) Int. Cl.
    *F21V 9/45*     (2018.01)
    *H05B 45/20*     (2020.01)
    *F21Y 113/10*     (2016.01)

(52) U.S. Cl.
    CPC .............. *F21V 9/45* (2018.02); *H05B 45/20* (2020.01); *F21Y 2113/10* (2016.08)

(58) Field of Classification Search
    None
    See application file for complete search history.

(56) References Cited

U.S. PATENT DOCUMENTS

| 10,697,591 | B1* | 6/2020 | Yeutter | H05B 45/395 |
| 2008/0303410 | A1 | 12/2008 | Kaneda et al. | |
| 2010/0060195 | A1 | 3/2010 | Tsuboi et al. | |
| 2010/0213861 | A1 | 8/2010 | Kaneda et al. | |
| 2010/0295464 | A1 | 11/2010 | Kasakura et al. | |
| 2011/0298387 | A1 | 12/2011 | Kaneda et al. | |
| 2012/0286238 | A1 | 11/2012 | Linton et al. | |
| 2013/0002157 | A1* | 1/2013 | van de Ven | H05B 45/60 315/192 |
| 2013/0221866 | A1 | 8/2013 | Kasakura et al. | |
| 2014/0036499 | A1 | 2/2014 | Yamakawa et al. | |
| 2015/0131259 | A1 | 5/2015 | Ouderkirk et al. | |
| 2015/0267903 | A1* | 9/2015 | Son | H05B 47/10 362/231 |

(Continued)

FOREIGN PATENT DOCUMENTS

| CN | 104075162 A | 10/2014 |
| CN | 210073838 A | 2/2020 |

(Continued)

*Primary Examiner* — Crystal L Hammond
(74) *Attorney, Agent, or Firm* — Hunton Andrews Kurth LLP

(57) ABSTRACT

A light emitting device includes one or more light emitting elements and a plurality of fluorescent materials, and emits a first light, a second light, and a third light, wherein the first light has a correlated color temperature between 1,500 K and 3,500 K and a color rendering index R9 of 50 or more, the second light has a correlated color temperature between 3,500 K and 5,500 K and a color rendering index R9 of 50 or more, the third light has values of X and Y coordinates in the chromaticity diagram of the CIE1931 color system smaller than the values of X and Y coordinates at a color temperature of 5,500 K on the black body radiation locus, and a light having a correlated color temperature of 6,500 K has a color rendering index R9 of 50 or more and a melanopic ratio of 1.0 or more.

12 Claims, 11 Drawing Sheets

(56) References Cited

U.S. PATENT DOCUMENTS

| | | |
|---|---|---|
| 2015/0287890 A1 | 10/2015 | Linton et al. |
| 2016/0284949 A1 | 9/2016 | Hagelaar et al. |
| 2017/0354000 A1* | 12/2017 | Gordin .................. H05B 45/20 |
| 2018/0056027 A1 | 3/2018 | Peeters et al. |
| 2018/0153018 A1 | 5/2018 | Matsubayashi et al. |
| 2019/0037654 A1 | 1/2019 | Harada et al. |
| 2019/0093832 A1* | 3/2019 | Soer .................. C09K 11/0883 |
| 2019/0371768 A1 | 12/2019 | You et al. |
| 2020/0104432 A1* | 4/2020 | Harrison ................ H04N 5/247 |
| 2020/0133045 A1* | 4/2020 | Yamamoto ........ G02F 1/136286 |
| 2020/0313045 A1 | 10/2020 | Asai et al. |

FOREIGN PATENT DOCUMENTS

| | | |
|---|---|---|
| JP | 2006148051 A | 6/2006 |
| JP | 2009238729 A | 10/2009 |
| JP | 3177205 U | 7/2012 |
| JP | 2012221755 A | 11/2012 |
| JP | 2013502047 A | 1/2013 |
| JP | 2015523722 A | 8/2015 |
| JP | 2016523443 A | 8/2016 |
| JP | 2017033811 A | 2/2017 |
| JP | 2018511386 A | 4/2018 |
| JP | 2018088374 A | 6/2018 |
| JP | 2019029109 A | 2/2019 |
| JP | 2020167399 A | 10/2020 |
| WO | 2008/069103 A1 | 6/2008 |
| WO | 2012/144087 A1 | 10/2012 |

* cited by examiner

LIGHT EMITTING DEVICE

CROSS-REFERENCE TO RELATED PATENT APPLICATION

This application claims priority to Japanese Patent Application No. 2020-113376, filed on Jun. 30, 2020, the disclosure of which is hereby incorporated reference in its entirety.

BACKGROUND

Technical Field

The present disclosure relates to a light emitting device.

Description of Related Art

Light, such as illumination and displays, has become an essential element in human work spaces. There are many hours in a day to receive light from inside buildings, computer equipment.

In recent years, there has been a movement to emphasize considering the influence on a human body in shaping a human work environment. One of them is, for example, a certification system called WELL certification (Well Building Standard) established by IWBI (International WELL Building Institute). WELL certification evaluates buildings such as offices on multiple items, such as air, water, food, light, and comfort, and gives certification if they meet the criteria. Examples of the verification item of light in WELL certification include consideration for the visual environment, consideration for circadian, consideration for glare from fixtures and sunlight, and color rendering properties.

Japanese Translation of PCT International Application Publication No. 2018-511386 proposes a lighting apparatus to support the human circadian rhythm.

The present disclosure has an object to provide a light emitting device in consideration of circadian rhythm and color rendering properties.

SUMMARY

The light emitting device disclosed in the present disclosure comprises one or more light emitting elements, at least one first fluorescent material, at least one second fluorescent material containing at least a fluorescent material different from the at least one first fluorescent material, and at least one third fluorescent material containing at least a fluorescent material different from the at least one first fluorescent material and the at least one second fluorescent material; and emits a first light from at least one of the one or more light emitting elements and the at least one first fluorescent material, a second light from at least one of the one or more light emitting elements and the at least one second fluorescent material, and a third light from at least one of the one or more light emitting elements and the at least one third fluorescent material, wherein the first light has a first color temperature with a correlated color temperature in a range of 1,500 K or more and 3,500 K or less, and has a color rendering index R9 of 50 or more, the second light has a second color temperature with a correlated color temperature in a range of 3,500 K or more and 5,500 K or less, wherein the second color temperature is higher than the first color temperature, and has a color rendering index R9 of 50 or more, the third light has values of X and Y coordinates in the chromaticity diagram of the CIE1931 color system that are smaller than the values of X and Y coordinates at a color temperature of 5,500 K on the black body radiation locus, and a light having a correlated color temperature of 6,500 K composed of two or more lights including at least the third light among the first light, the second light, and the third light, has a color rendering index R9 of 50 or more and a melanopic ratio of 1.0 or more.

In accordance with the present disclosure, a light emitting device in consideration of circadian rhythm and color rendering properties can be provided.

DETAILED DESCRIPTION

First, the effect of illumination on a human body will be described.

As an example, the WELL certification described in the background requires an illumination design in consideration of circadian. Here, consideration of circadian means consideration of circadian rhythm.

The circadian rhythm of human beings is longer than one day and is approximately 25 hours, and when it is not adjusted to one day, that is, a 24 hours cycle, the rhythm cycle deviates from one day. Light thus plays an important role as a synchronization factor for adjusting to 24 hours. The human biological clock is adjusted to 24 hours by being exposed to the sunlight, which naturally causes people to live in the rhythm of one day, such as waking up in the morning and going to sleep at night.

In other words, the human body is equipped with a synchronization function utilizing light in order to live in a 24-hour rhythm. Specifically, there is a very small area in the hypothalamus of the brain called the suprachiasmatic nucleus, which plays the role of the biological clock that controls circadian rhythm. In addition, as a cell for giving a light signal to the suprachiasmatic nucleus, there is an intrinsically photosensitive retinal ganglion cell (hereinafter referred to as "ipRGC") on the retina.

The ipRGC contains a photoreceptor protein called melanopsin, and it has been clarified that melanopsin is involved in the light synchronization of circadian rhythm. Melanopsin has absorption characteristics according to the wavelength of light, and the peak is in the vicinity of 480 to 490 nm.

Melanopsin is also involved in secretion or suppression of melatonin which is a sleep promoting hormone, and it is considered that, for example, the secretion of melatonin is suppressed by increasing the amount of stimulation to the ipRGC. Normally, the peak of melatonin secretion in the body comes at night, and the secretion of melatonin promotes sleep. The secretion of melatonin is thus suppressed during the day.

The WELL certification introduces an equivalent melanopic lux (hereinafter referred to as "EML") in order to evaluate whether or not the illumination design is in consideration of circadian. The EML is calculated by the following formula (1):

EML=Illuminance×Meranopic Ratio  (1)

Figure 1:
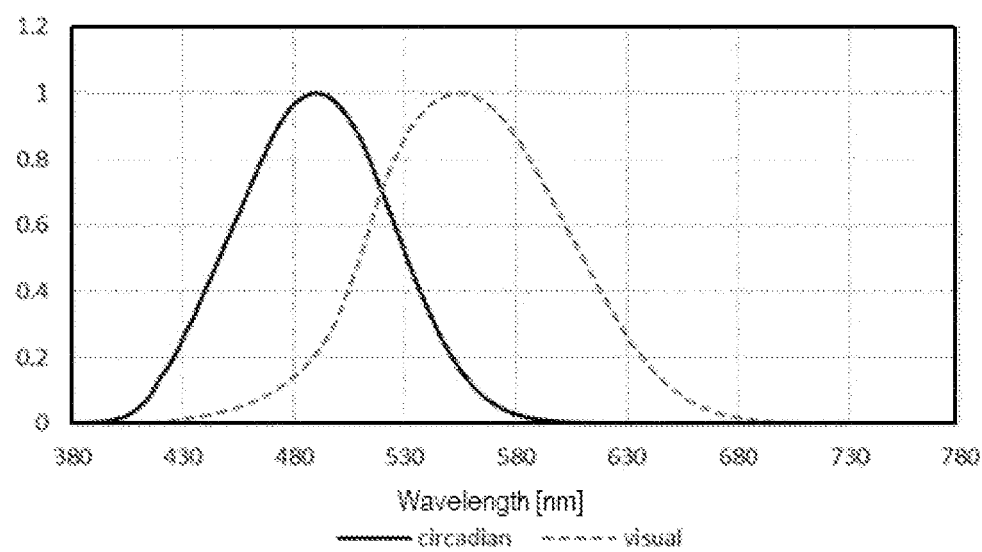
FIG. 1 is a graph showing curves of a circadian response and a visual sensitivity response.

The melanopic ratio (hereinafter referred to as "MR") in the formula (1) is calculated by the following formula (2):

$$\text{Meranopic Ratio} = \frac{\sum_{730}^{380} \text{Light} \times \text{Circadian}}{\sum_{730}^{380} \text{Light} \times \text{Visual}} \times 1.218 \quad (2)$$

wherein the "Light" represents a spectral distribution of light by an illumination fixture, the "Circadian" represents a circadian response based on spectral sensitivity characteristics of the above-mentioned melanopsin having a peak in the vicinity of 480 to 490 nm, and the "Visual" represents a visual sensitivity response. FIG. 1 is a graph showing curves of a circadian response and a visual sensitivity response.

As seen from the formula (1), there are two possible ways of increasing the EML value: increasing illuminance or increasing MR. Further, it can be seen that the dependence on the characteristics of circadian rhythm is larger in MR than in illuminance. Therefore, in consideration of circadian rhythm, it can be considered that considering the MR value is preferred.

Embodiments for carrying out the present disclosure will be hereunder described with reference to the drawings. The embodiments described below are intended to embody the technical idea of the present disclosure and are not intended to limit the present disclosure. Further, in the following description, the same name or symbol represents the same or equivalent member, and detailed description thereof will be omitted as appropriate. The sizes and positional relationships of members shown in each drawing may be exaggerated for clarity of explanation.

The relationship between color names and chromaticity coordinates, and the relationship between wavelength ranges of light and color names of monochromic light are in accordance with Japanese Industrial Standard (JIS) Z8110. Further, the color rendering index is in accordance with JIS Z8726. In this specification, the "fluorescent material" is used in the same meaning as a "fluorescent phosphor".

<Embodiment>

A light emitting device 1 according to an embodiment of the present disclosure will be described. The light emitting device 1 is, for example, an illumination device. It is also, for example, a display device such as a television or a computer display. It is also, for example, a package equipped with a light emitting element such as an LED (light emitting diode) that is mounted on an illumination device or a display device. It is not limited to these.

Figure 2:
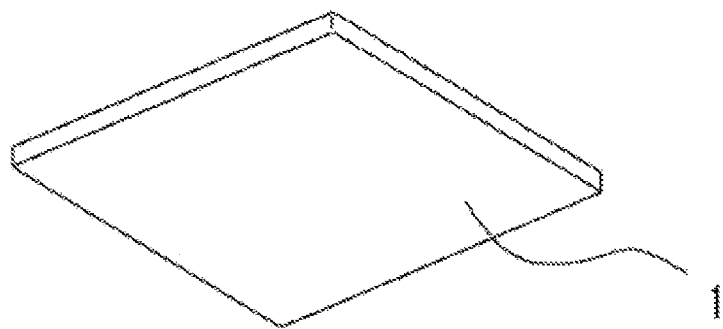
FIG. 2 is a schematic perspective view showing an example of the light emitting device according to an embodiment of the present disclosure.
Figure 3A:
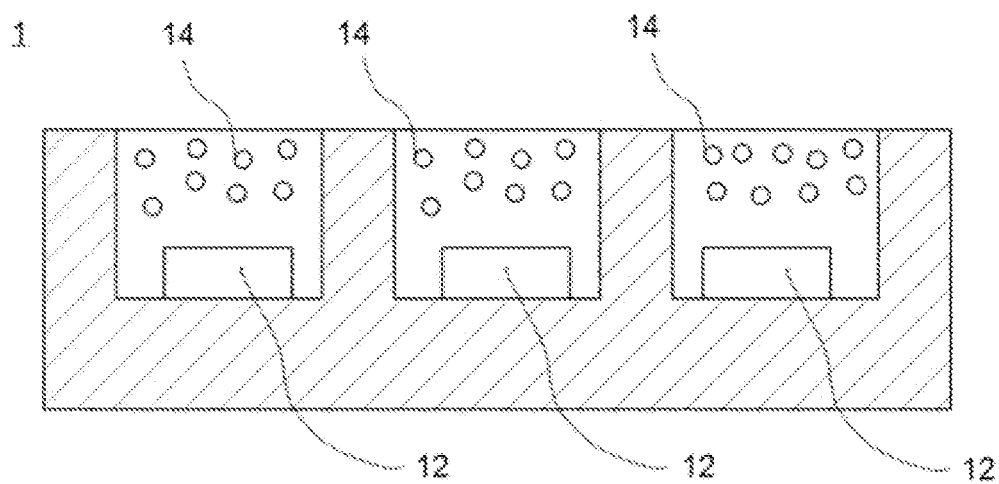
FIG. 3A is a schematic cross-sectional view showing another example of the light emitting device according to the embodiment.
Figure 3B:
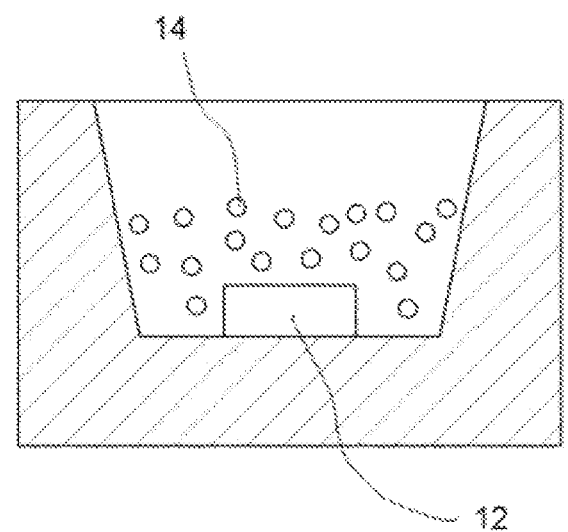
FIG. 3B is a schematic cross-sectional view showing an example of the LED package according to the embodiment.

FIG. 2 shows an example of the light emitting device 1 as an illumination device. FIG. 3A shows an example of the light emitting device 1 as an LED package. For example, a plurality of LED packages shown in FIG. 3A is mounted in the light emitting device 1 serving as an illumination device shown in FIG. 2. For example, instead of the LED package including a plurality of light emitting elements 12 and a plurality of fluorescent materials 14, a plurality of LED packages including one light emitting element 12 and one or more fluorescent materials 14 may be mounted, as shown in FIG. 3B.

The light emitting device 1 can change the correlated color temperature of emitted light (hereinafter referred to as "emitting light"). Actually, the mechanism to control this change may be incorporated in the light emitting device 1, or may be realized by an external device connected to the light emitting device 1. The light emitting device 1 can emit at least emitting light having different correlated color temperatures.

In the case where the light emitting device 1 is an illumination device, the emitting light is illumination emitted from the illumination device. In the case where the light emitting device 1 is a display device, the emitting light is, for example, a backlight. In the case where the light emitting device 1 is a package, the emitting light is light emitted from the package to the outside.

The light emitting device 1 may include one or more light emitting elements 12, and a plurality of fluorescent materials 14. The light emitting device 1 may also include a plurality of types of fluorescent materials 14 having different compositions. The light emitting device 1 also uses one or more light emitting elements 12 and one or more fluorescent materials 14, which are selected from the one or more light emitting elements 12 and the plurality of fluorescent materials 14, to thereby emit a plurality of lights having different light emission spectra from each other. The light emitting device 1 can also change the correlated color temperature within a predetermined range by adjusting the ratio of the plurality of lights and combining them.

For example, the light emitting device 1 can change the correlated color temperature in a range of 2,700 K or more and 6,500 K or less. The range of the correlated color temperature that can be changed in the light emitting device 1 is not limited to the above. For example, it may be in a range of 3,000 K or more and 6,000 K or less.

Here, the light emitted from the selected one or more light emitting elements 12 and the one or more fluorescent materials 14 is referred to as single light. In other words, it can be said that the light emitting device 1 emits a plurality of single lights having different light emission spectra from each other. In addition, the light obtained by combining a plurality of single lights is referred to as mixed light. The light emitting device 1 can emit single light or mixed light as the emitting light.

The plurality of single lights emitted from the light emitting device 1 is respectively plotted at a different chromaticity coordinate in the chromaticity diagram of the CIE1931 color system (hereinafter simply referred to as "chromaticity diagram"). In other words, the plurality of single lights is respectively a light having a different chromaticity coordinate in the chromaticity diagram.

At least two or more single lights out of the plurality of single lights use one or more fluorescent materials different from each other. One or more of the same fluorescent materials may be used. All single lights may use one or more fluorescent materials different from each other.

The plurality of single lights emitted by the light emitting device 1 includes at least three single lights. Here, the three single lights are respectively referred to as a first light, a second light, and a third light. Each light will be hereunder described.

(First Light)

The first light is a light having a correlated color temperature in a range of 1,500 K or more and 3,500 K or less. Here, when indicating the correlated color temperature for a specific light, unless otherwise specified, it is assumed to indicate the correlated color temperature having a color deviation in a range of ±0.02.

The first light has an average color rendering index Ra of 80 or more. Preferably, the first light has an average color rendering index Ra of 90 or more. More preferably, the first light has an average color rendering index Ra of 95 or more.

The first light has a color rendering index R9 of 50 or more. Preferably, the first light has a color rendering index R9 of 60 or more. More preferably, the first light has a color rendering index R9 of 65 or more. The color rendering index R9 is a value used for evaluating the color rendering property of red.

The first light has a color rendering index R15 of 75 or more. Preferably, the first light has a color rendering index R15 of 85 or more. More preferably, the first light has a color rendering index R15 of 90 or more. The color rendering index R15 is a value used for evaluating the color rendering property of Japanese skin tones.

The first light has an MR value of 0.70 or less. Preferably, the first light has an MR value of 0.60 or less. More preferably, the first light has an MR value of 0.55 or less.

For example, the first light is emitted from a light emitting device 12 which is a nitride semiconductor and has a light emission peak in a range of 410 nm or more and 490 nm or less, a rare earth aluminate fluorescent material 14 having a composition represented by a formula of $Y_3(Al,Ga)_5O_{12}$:Ce and having a light emission peak in the vicinity of 496 nm as a main fluorescent material, and a fluoride fluorescent material 14 having a composition represented by a formula of $K_2SiF_6$:$Mn^{4+}$ and having a light emission peak in the vicinity of 630 nm.

Figure 4:
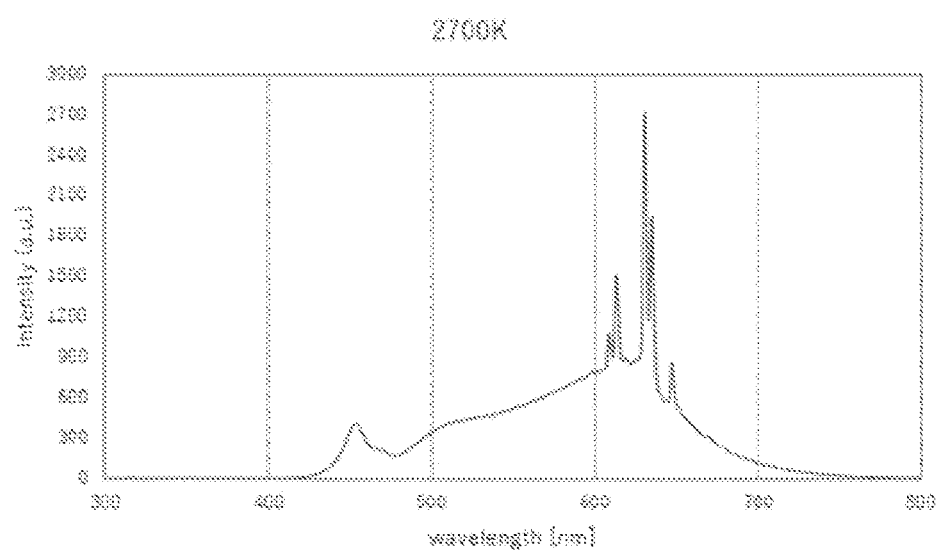
FIG. 4 is a graph showing an example of the light emission spectrum of the first light emitted by the light emitting device according to the embodiment.

FIG. 4 shows a specific example of the light emission spectrum of the first light. The first light in this specific example has a correlated color temperature of 2,700 K, an average color rendering index Ra of 96, a color rendering index R9 of 68, a color rendering index R15 of 94, and an MR value of 0.51. The first light is a light that is excellent in the values of the average color rendering index Ra and the color rendering index R15, and has a good value of the color rendering index R9 and a low MR value.

Here, as for the average color rendering index Ra, a value in a range of 80 or more and less than 90 is considered good, and a value of 90 or more is considered excellent. As for the color rendering index R9, a value in a range of 50 or more and less than 70 is considered good, and a value of 70 or more is considered excellent. As for the color rendering index R15, a value in a range of 75 or more and less than 85 is considered good, and a value of 85 or more is considered excellent. In the case where the value is below the range considered to be good, it is considered to be not good.

(Second Light)

The second light may be a light having a correlated color temperature in a range of 3,500 K or more and 5,500 K or less. The second light may also be a light having a correlated color temperature in a range of 3,500 K or more and 4,500 K or less. The second light may also be a light having a correlated color temperature in a range of 4,500 K or more and 5,500 K or less.

The second light has an average color rendering index Ra of 80 or more. Preferably, the second light has an average color rendering index Ra of 90 or more. More preferably, the second light has an average color rendering index Ra of 95 or more.

The second light has a color rendering index R9 of 50 or more. Preferably, the second light has a color rendering index R9 of 70 or more. More preferably, the second light has a color rendering index R9 of 80 or more.

The second light has a color rendering index R15 of 75 or more. Preferably, the second light has a color rendering index R15 of 85 or more. More preferably, the second light has a color rendering index R15 of 90 or more. Particularly preferably, the second light has a color rendering index R15 of 95 or more.

The second light has an MR value in a range of 0.55 or more and 1.00 or less. Preferably, the second light has an MR value in a range of 0.60 or more and 0.90 or less. More preferably, the second light has an MR value in a range of 0.65 or more and 0.75 or less.

For example, the second light may be emitted from a light emitting device 12 which is a nitride semiconductor and has a light emission peak in a range of 410 nm or more and 490 nm or less, a rare earth aluminum garnet fluorescent material having a composition represented by a formula of $Lu_3Al_5O_{12}$:Ce and having a light emission peak in the vicinity of 520 nm as a main fluorescent material, and a fluoride fluorescent material having a composition represented by a formula of $K_2SiF_6$:$Mn^{4+}$ and having a light emission peak in the vicinity of 630 nm.

Figure 5:
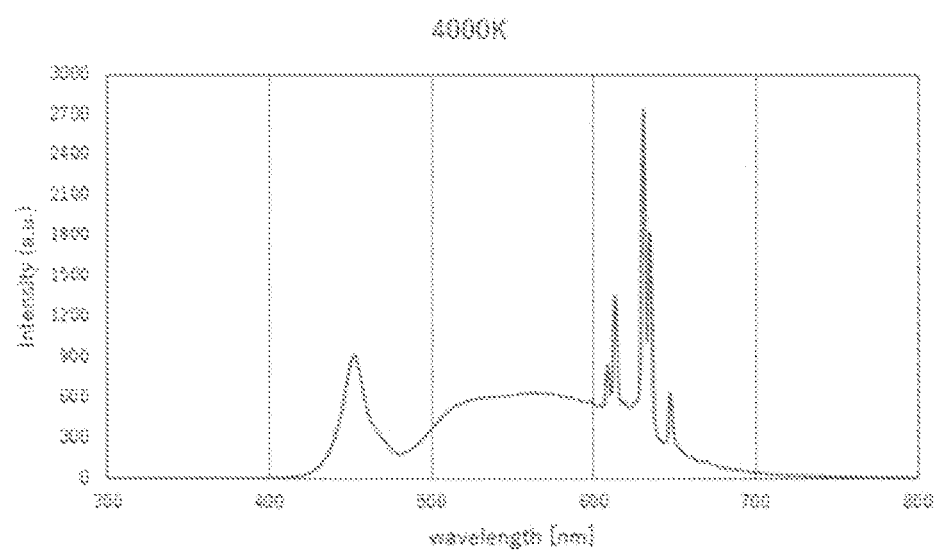
FIG. 5 is a graph showing an example of the light emission spectrum of the second light emitted by the light emitting device according to the embodiment.

FIG. 5 shows a specific example of the light emission spectrum of the second light emitted from the above-mentioned light emitting element 12 and the fluorescent materials. The second light in this specific example has a correlated color temperature of 4,000 K, an average color rendering index Ra of 94, a color rendering index R9 of 82, a color rendering index R15 of 95, and an MR value of 0.69. The second light has excellent values of the average color rendering index Ra, the color rendering index R9, and the color rendering index R15.

For example, the second light may also be emitted from a light emitting device 12 which is a nitride semiconductor and has a light emission peak in a range of 410 nm or more and 490 nm or less, a rare earth aluminate fluorescent material having a composition represented by a formula of $Y_3(Al,Ga)_5O_{12}$:Ce and having a light emission peak in the vicinity of 520 nm as a main fluorescent material, and a fluoride fluorescent material having a composition represented by a formula of $K_2SiF_6$:$Mn^{4+}$ and having a light emission peak in the vicinity of 630 nm.

Figure 6:
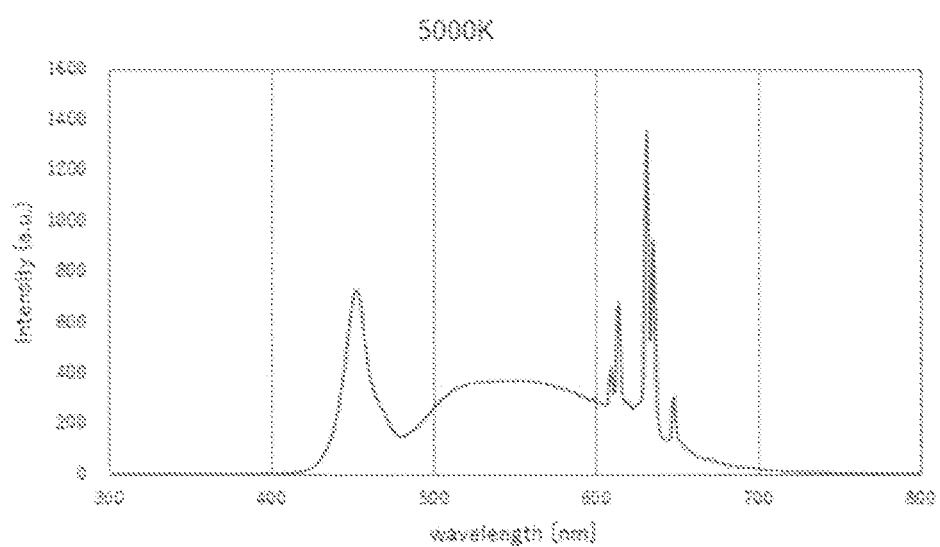
FIG. 6 is a graph showing another example of the light emission spectrum of the second light emitted by the light emitting device according to the embodiment.

FIG. 6 shows another specific example of the light emission spectrum of the second light emitted from the above-mentioned light emitting element 12 and the fluorescent materials. The second light in this specific example has a correlated color temperature of 5,000 K, an average color rendering index Ra of 94, a color rendering index R9 of 86, a color rendering index R15 of 95, and an MR value of 0.85.

The second light has excellent values of the average color rendering index Ra, the color rendering index R9, and the color rendering index R15.

Figure 7:
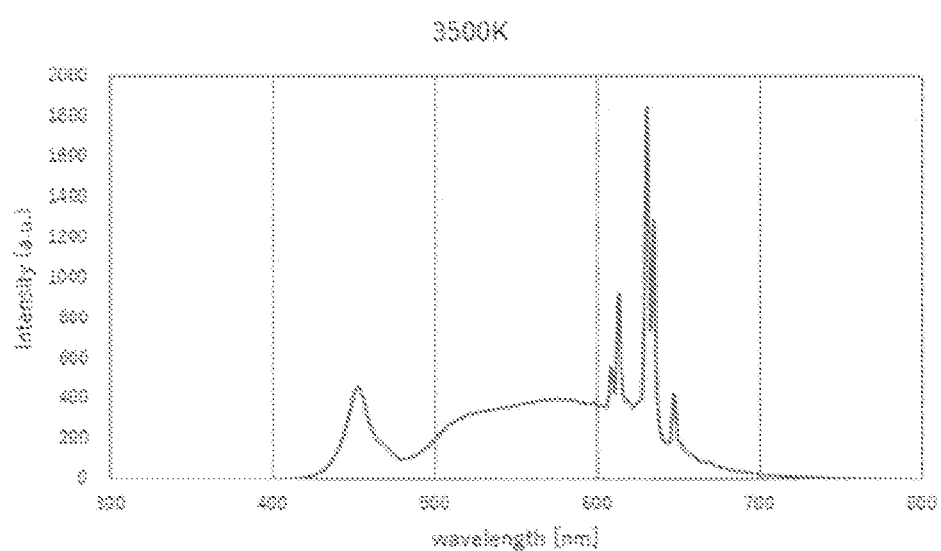
FIG. 7 is a graph showing another example of the light emission spectrum of the second light emitted by the light emitting device according to the embodiment.

FIG. 7 shows another specific example of the light emission spectrum of the second light emitted from the above-mentioned light emitting element 12 and the fluorescent materials 14. The second light in this specific example has a correlated color temperature of 3,500 K, an average color rendering index Ra of 95, a color rendering index R9 of 79, a color rendering index R15 of 96, and an MR value of 0.62. The second light has excellent values of the average color rendering index Ra, the color rendering index R9, and the color rendering index R15.

(Third Light)

The third light may be a light of which the values of X and Y coordinates in the chromaticity diagram are plotted to values that are smaller than those of X and Y coordinates at a color temperature of 5,500 K on the black body radiation locus. The third light may also be a light that is not plotted in a range where the correlated color temperature is 6,500 K or less in the chromaticity diagram. The third light may also be a light that is not plotted in a range where the correlated color temperature is 8,000 K or less in the chromaticity diagram.

The third light has an MR value of 1.80 or more. Preferably, the third light has an MR value of 2.00 or more. More preferably, the third light has an MR value of 2.20 or more. The third light also has an MR value of 3.00 or less.

The third light has a color rendering index R9 of less than 50. Alternatively, the third light has a color rendering index R9 of less than 30. Alternatively, the third light has a color rendering index R9 of less than 10.

The third light has a color rendering index R15 of less than 50. Alternatively, the third light has a color rendering index R15 of less than 30. Alternatively, the third light has a color rendering index R15 of less than 10.

The third light may be emitted from a light emitting device 12 which is a nitride semiconductor and has a light emission peak in a range of 410 nm or more and 490 nm or less, and an alkaline earth metal aluminate fluorescent material having a composition represented by a formula of $Sr_4Al_{14}O_{25}$:Eu and having a light emission peak in the vicinity of 495 nm as a main fluorescent material.

Figure 8:
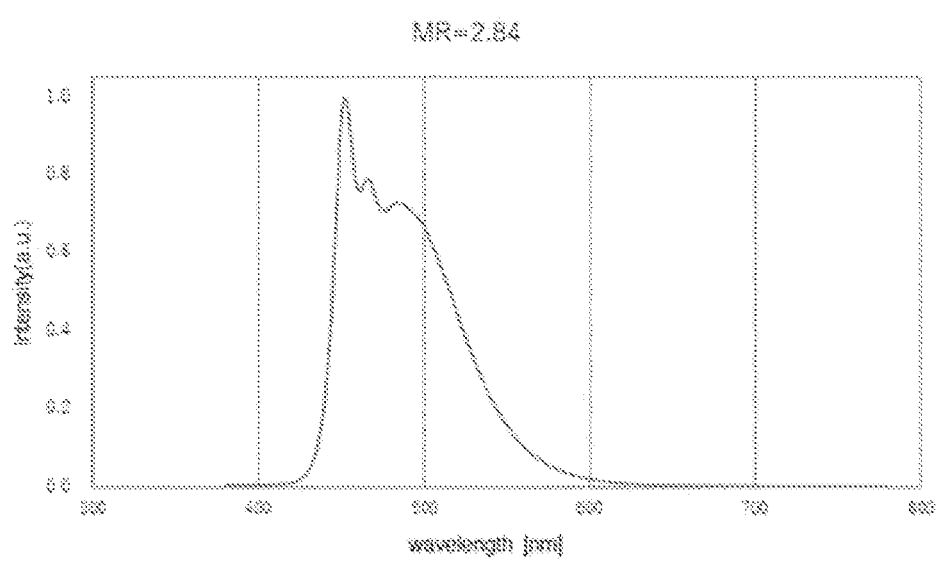
FIG. 8 is a graph showing an example of the light emission spectrum of the third light emitted by the light emitting device according to the embodiment.

FIG. 8 shows a specific example of the light emission spectrum of the third light. The third light in this specific example has an X coordinate of 0.146 and a Y coordinate of 0.237 in the chromaticity diagram, and has an MR value of 2.84. Further, the third light has a color rendering index R9 of 0, and a color rendering index R15 of 0. As shown in FIG. 8, the third light is a light having a high MR value corresponding to the circadian response. While the third light is specialized for MR, it is not good for the color rendering index R9 and the color rendering index R15.

Next, in the light emitting device 1, the changes in the values of the average color rendering index Ra, the color rendering index R9, the color rendering index R15, and the MR value when changing the correlated color temperature by using the first light, the second light, and the third light, will be described. Prior to this description, a conventional light emitting device to be compared (hereinafter referred to as "comparative light emitting device") will be described. This comparative light emitting device is a light emitting device selected in terms of the balance between good luminous efficiency and high average color rendering index Ra, which is adopted in conventional illumination devices.

(Comparative Light Emitting Device)

The comparative light emitting device is composed of two single lights having a correlated color temperature of 2,700 K and 6,500 K, respectively. Each of the single lights is emitted from: a light emitting element 12 which is a nitride semiconductor and has a light emission peak in a range of 410 nm or more and 490 nm or less; and fluorescent materials including a rare earth aluminate fluorescent material having a composition represented by a formula of $Y_3Al_5O_{12}$:Ce, a rare earth aluminate fluorescent material having a composition represented by a formula of $Lu_3Al_5O_{12}$:Ce, and a silicon nitride fluorescent material having a composition represented by a formula of (Sr,Ca)$AlSiN_3$:Eu.

The comparative light emitting device achieves an average color rendering index Ra of 80 or more and a luminous efficiency of 180 to 200 lm/W in the correlated color temperature range of 2,700 K or more and 6,500 K or less. On the other hand, the MR value is below 1.00 at the maximum. The variation width of the MR value is less than 0.55 in the correlated color temperature range of 2,700 K or more and 6,500 K or less. The detailed values of the average color rendering index Ra, the color rendering index R9, the color rendering index R15, and the MR value at predetermined correlated color temperatures are shown in Table 1 below.

TABLE 1

|     | 6500K | 5000K | 4000K | 3500K | 3000K | 2700K |
|-----|-------|-------|-------|-------|-------|-------|
| Ra  | 84    | 86    | 86    | 85    | 83    | 82    |
| R9  | 10    | 21    | 23    | 19    | 9     | 4     |
| R15 | 77    | 81    | 81    | 79    | 74    | 72    |
| MR  | 0.95  | 0.82  | 0.70  | 0.62  | 0.52  | 0.44  |

(First Reference Light Emitting Device)

Next, a light emitting device obtained by using the comparative light emitting device and replacing the single light having a correlated color temperature of 6,500 K adopted in the comparative light emitting device with the third light specialized for MR, will be described as a reference. This light emitting device is referred to as a first reference light emitting device.

The first reference light emitting device has an average color rendering index Ra of 80 or more and an MR value of more than 1.20 at the maximum in the correlated color temperature range of 2,700 K or more and 6,500 K or less. The variation width of the MR value is more than 0.80 in the correlated color temperature range of 2,700 K or more and 6,500 K or less. This means that a higher MR value is achieved by the third light. On the other hand, the value of the color rendering index R9 is less than 50 at the correlated color temperature of 3,500 K or less, and the value of the color rendering index R15 is less than 75 at the correlated color temperature of 2,700 K. The detailed values of the average color rendering index Ra, the color rendering index R9, the color rendering index R15, and MR at predetermined correlated color temperatures are shown in Table 2 below.

TABLE 2

|     | 6500K | 5000K | 4000K | 3500K | 3000K | 2700K |
|-----|-------|-------|-------|-------|-------|-------|
| Ra  | 86    | 88    | 91    | 89    | 84    | 81    |
| R9  | 91    | 75    | 52    | 30    | 12    | −1    |
| R15 | 91    | 95    | 92    | 84    | 76    | 70    |
| MR  | 1.23  | 1.01  | 0.81  | 0.65  | 0.51  | 0.42  |

(Second Reference Light Emitting Device)

Next, a light emitting device obtained by using the first reference light emitting device and replacing the single light having a correlated color temperature of 2,700 K adopted in the first reference light emitting device (also adopted in the comparative light emitting device) with the first light having a good color rendering index R9 value, will be described as a reference. This light emitting device is referred to as a second reference light emitting device.

The second reference light emitting device has an average color rendering index Ra of 75 or more and an MR value of more than 1.20 at the maximum in the correlated color temperature range of 2,700 K or more and 6,500 K or less. The variation width of the MR value is more than 0.75 in the correlated color temperature range of 2,700 K or more and 6,500 K or less. Similar to the first reference light emitting device, a higher MR value is achieved by the third light. On the other hand, the value of the color rendering index R9 is less than 50 at the correlated color temperature of 6,500 K, and the value of the color rendering index R15 is less than 85 at the correlated color temperature of 4,000 K or more. The detailed values of the average color rendering index Ra, the color rendering index R9, the color rendering index R15, and MR at predetermined correlated color temperatures are shown in Table 3 below.

TABLE 3

|     | 6500K | 5000K | 4000K | 3500K | 3000K | 2700K |
| --- | --- | --- | --- | --- | --- | --- |
| Ra  | 79 | 82 | 85 | 89 | 93 | 96 |
| R9  | 41 | 56 | 75 | 90 | 84 | 68 |
| R15 | 75 | 79 | 84 | 90 | 98 | 94 |
| MR  | 1.28 | 1.08 | 0.90 | 0.78 | 0.62 | 0.51 |

(First Light Emitting Device)

Next, a first light emitting device, which is an example of the light emitting device 1, will be described. The first light emitting device is the light emitting device 1, which adopts the first light shown in FIG. 4, the second light shown in FIG. 5, and the third light shown in FIG. 8.

The first light emitting device has an average color rendering index Ra of 90 or more and an MR value of more than 1.10 at the maximum in the correlated color temperature range of 2,700 K or more and 6,500 K or less. The variation width of the MR value is more than 0.60 in the correlated color temperature range of 2,700 K or more and 6,500 K or less. The color rendering index R9 is 60 or more in the correlated color temperature range of 2,700 K or more and 6,500 K or less, 70 or more at the correlated color temperature of 3,000 K or more, and 80 or more at the correlated color temperature of 3,500 K or more. The color rendering index R15 is 90 or more in the correlated color temperature range of 2,700 K or more and 6,500 K or less.

The first light emitting device not only achieves a higher MR value than that of the conventional one by the third light, but also has a good color rendering index R9 value. Furthermore, the color rendering index R15 value is also excellent. The detailed values of the average color rendering index Ra, the color rendering index R9, the color rendering index R15, and MR at predetermined correlated color temperatures are shown in Table 4 below.

TABLE 4

|     | 6500K | 5000K | 4000K | 3500K | 3000K | 2700K |
| --- | --- | --- | --- | --- | --- | --- |
| Ra  | 94 | 98 | 94 | 96 | 97 | 96 |
| R9  | 84 | 97 | 82 | 81 | 76 | 68 |
| R15 | 91 | 96 | 95 | 97 | 96 | 94 |
| MR  | 1.15 | 0.93 | 0.70 | 0.64 | 0.58 | 0.52 |

(Second Light Emitting Device)

Next, a second light emitting device, which is an example of the light emitting device 1, will be described. The second light emitting device is the light emitting device 1, which adopts the first light shown in FIG. 4, the second light shown in FIG. 6, and the third light shown in FIG. 8.

The second light emitting device has an average color rendering index Ra of 90 or more and an MR value of more than 1.00 at the maximum in the correlated color temperature range of 2,700 K or more and 6,500 K or less. The variation width of the MR value is more than 0.55 in the correlated color temperature range of 2,700 K or more and 6,500 K or less. The color rendering index R9 is 60 or more in the correlated color temperature range of 2,700 K or more and 6,500 K or less, 70 or more at the correlated color temperature of 3,000 K or more, and 80 or more at the correlated color temperature of 3,500 K or more. The color rendering index R15 is 90 or more in the correlated color temperature range of 2,700 K or more and 6,500 K or less.

The second light emitting device not only achieves a higher MR value than that of the conventional one by the third light, but also has a good color rendering index R9 value. Furthermore, the color rendering index R15 value is also excellent. The detailed values of the average color rendering index Ra, the color rendering index R9, the color rendering index R15, and MR at predetermined correlated color temperatures are shown in Table 5 below.

TABLE 5

|     | 6500K | 5000K | 4000K | 3500K | 3000K | 2700K |
| --- | --- | --- | --- | --- | --- | --- |
| Ra  | 98 | 94 | 97 | 97 | 96 | 96 |
| R9  | 98 | 86 | 90 | 86 | 77 | 68 |
| R15 | 95 | 95 | 99 | 99 | 97 | 94 |
| MR  | 1.09 | 0.86 | 0.77 | 0.67 | 0.59 | 0.52 |

In view of the overall correlated color temperature range of 2,700 K or more and 6,500 K or less, the second light emitting device tends to have a slightly lower MR value, but a slightly higher color rendering index R9 value, compared to the first light emitting device. The color rendering index R15 value also tends to be slightly higher. That is, it can be said that the second light emitting device emphasizes the value of the color rendering index R9 or the color rendering index R15, compared to the first light emitting device.

(Third Light Emitting Device)

Next, a third light emitting device, which is an example of the light emitting device 1, will be described. The third light emitting device is the light emitting device 1, which adopts the first light shown in FIG. 4, the second light shown in FIG. 7, and the third light shown in FIG. 8.

The third light emitting device has an average color rendering index Ra of 90 or more and an MR value of more than 1.10 at the maximum in the correlated color temperature range of 2,700 K or more and 6,500 K or less. The variation width of the MR value is more than 0.65 in the correlated color temperature range of 2,700 K or more and 6,500 K or less. The color rendering index R9 is 60 or more in the correlated color temperature range of 2,700 K or more and 6,500 K or less, and 70 or more at the correlated color temperature of 3,000 K or more. The color rendering index R15 is 80 or more in the correlated color temperature range of 2,700 K or more and 6,500 K or less, and 90 or more at the correlated color temperature of 5,000 K or less.

The third light emitting device not only achieves a higher MR value than that of the conventional one by the third light, but also has a good color rendering index R9 value. Furthermore, the color rendering index R15 value is also excellent. The detailed values of the average color rendering index Ra, the color rendering index R9, the color rendering index R15, and MR at predetermined correlated color temperatures are shown in Table 6 below.

TABLE 6

|  | 6500K | 5000K | 4000K | 3500K | 3000K | 2700K |
|---|---|---|---|---|---|---|
| Ra | 90 | 94 | 97 | 95 | 96 | 96 |
| R9 | 71 | 85 | 96 | 79 | 74 | 68 |
| R15 | 87 | 91 | 97 | 96 | 96 | 94 |
| MR | 1.19 | 0.97 | 0.77 | 0.62 | 0.57 | 0.52 |

In view of the overall correlated color temperature range of 2,700 K or more and 6,500 K or less, the third light emitting device tends to have a slightly higher MR value, but a slightly lower color rendering index R9 value, compared to the first light emitting device. The color rendering index R15 value also tends to be slightly low. That is, it can be said that the third light emitting device emphasizes the MR value compared to the first light emitting device.

Accordingly, all of the first, second, and third light emitting devices achieve higher MR values and larger MR variation widths than those of the conventional one in the correlated color temperature range of 2,700 K or more and 6,500 K or less. The same applies to the first and second reference light emitting devices in this respect; and the first and second reference light emitting devices can achieve higher maximum MR values and larger MR variation widths than those of the first, second, and third light emitting devices. That is, from the viewpoint of MR, such light emitting devices can be expected to obtain superior effects compared to conventional ones.

In addition, the first, second, and third light emitting devices exhibit good or excellent characteristics in terms of color rendering index R9 over a wide range of correlated color temperatures. In this respect, it can be said that the first, second, and third light emitting devices are superior to the first and second reference light emitting devices.

The second light has a correlated color temperature in the range of 3,500 K or more and 5,500 K or less, and the MR value of the light emitting device 1 at the correlated color temperature of 6,500 K becomes higher as the correlated color temperature of the second light is closer to the lower limit (3,500 K). The overall color rendering index R9 value also improves as the correlated color temperature of the second light is closer to the upper limit (5,500 K).

In other words, by changing the correlated color temperature of the second light, the balance between the MR value and the color rendering index R9 value can be appropriately adjusted. The same applies to the balance between the MR value and the color rendering index R15 value.

The maximum value of the correlated color temperature achieved in the light emitting device 1 may not be limited to 6,500 K. It may be more than 6,500 K or may be less than 6,500 K, but is higher than the correlated color temperature of the second light. The correlated color temperature of the first light can be equal to or less than the minimum value of the correlated color temperature achieved in the light emitting device 1. In the case where the first light among the plurality of single lights provided in the light emitting device 1 is a light having the lowest correlated color temperature, the correlated color temperature of the first light is equal to or less than the minimum value of the correlated color temperature achieved in the light emitting device 1.

The light emitting device 1 achieves a color rendering index R9 of 50 or more and an MR value of 1.0 or more in the light having a correlated color temperature of 6,500 K composed of two or more lights including at least the third light among the first light, the second light, and the third light. In addition, the color rendering index R15 value is 85 or more. Furthermore, the light emitting device 1 achieves a color rendering index R9 of 50 or more in the light having a correlated color temperature of 2,700 K composed of one or more lights including at least the first light among the first light, the second light, and the third light.

The light emitting device 1 also achieves a color rendering index R9 of 70 or more in the light having a correlated color temperature of 6,500 K composed of two or more lights including at least the third light among the first light, the second light, and the third light.

The light emitting device 1 also achieves an MR value of 1.05 or more in the light having a correlated color temperature of 6,500 K composed of two or more lights including at least the third light among the first light, the second light, and the third light.

The light emitting device 1 also achieves a color rendering index R9 of 80 or more and an MR value of 1.10 or more in the light having a correlated color temperature of 6,500 K composed of two or more lights including at least the third light among the first light, the second light, and the third light.

The light emitting device 1 also achieves a color rendering index R9 of 90 or more and an MR value of 1.05 or more in the light having a correlated color temperature of 6,500 K composed of two or more lights including at least the third light among the first light, the second light, and the third light.

The light emitting device 1 also achieves a color rendering index R9 of 70 or more and an MR value of 1.15 or more in the light having a correlated color temperature of 6,500 K composed of two or more lights including at least the third light among the first light, the second light, and the third light.

Further, the light emitting device 1 has an MR variation width of 0.55 or more and a color rendering index R9 of 65 or more in the correlated color temperature range of 2,700 K or more and 6,500 K or less. The MR value monotonically increases as the correlated color temperature increases. The MR value may not increase linearly as long as it increases monotonically.

The light emitting device 1 has an average color rendering index Ra of 80 or more in the correlated color temperature range of 2,700 K or more and 6,500 K or less. The light emitting device 1 also has a color rendering index R15 of 85 or more in the correlated color temperature range of 2,700 K or more and 6,500 K or less. The correlated color temperature of the first light is in a range of 1,500 K or more and 2,700 K or less.

The light emitting device 1 has a color rendering index R9 of 75 or more in the correlated color temperature range of 3,500 K or more and 6,500 K or less. The light emitting device 1 also has a color rendering index R9 of 80 or more in the correlated color temperature range of 3,500 K or more and 6,500 K or less. The light emitting device 1 also has a color rendering index R9 of 85 or more in the correlated color temperature range of 3,500 K or more and 6,500 K or less.

(Toning Control System)

Next, toning control performed using the light emitting device 1 will be described. Here, a situation where a plurality of light emitting devices 1 as illumination devices is installed in a living room in a building, is assumed. The light emitting device 1 as an illumination device is not limited to such a providing embodiment.

As long as the color temperature is within the range of the correlated color temperature that can be adjusted by the light emitting device 1, the information processing device 2 that controls illumination by the light emitting device 1 can perform toning within a desired range. In other words, the correlated color temperature of the illumination may be adjusted in a range smaller than the range where the light emitting device 1 can perform toning.

Figure 9:
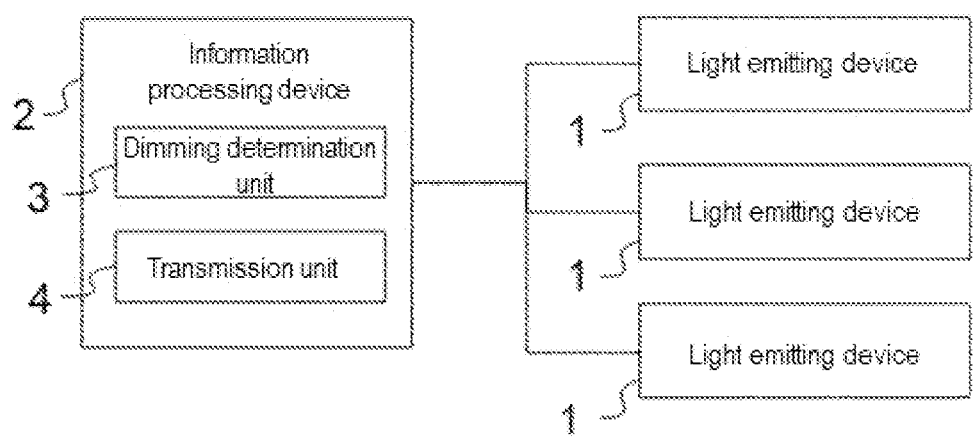
FIG. 9 is a system constitution diagram showing an example of the toning control system according to the embodiment.

The toning control system includes a plurality of light emitting devices 1 and an information processing device 2. The plurality of light emitting devices 1 and the information processing device 2 are communicably connected, and the information processing device 2 transmits control signals to the light emitting devices 1 via communication means, thereby controlling the illumination by the light emitting devices 1. FIG. 9 is a diagram showing an example of the constitution of the toning control system. The number of light emitting devices 1 may be one.

Figure 10:
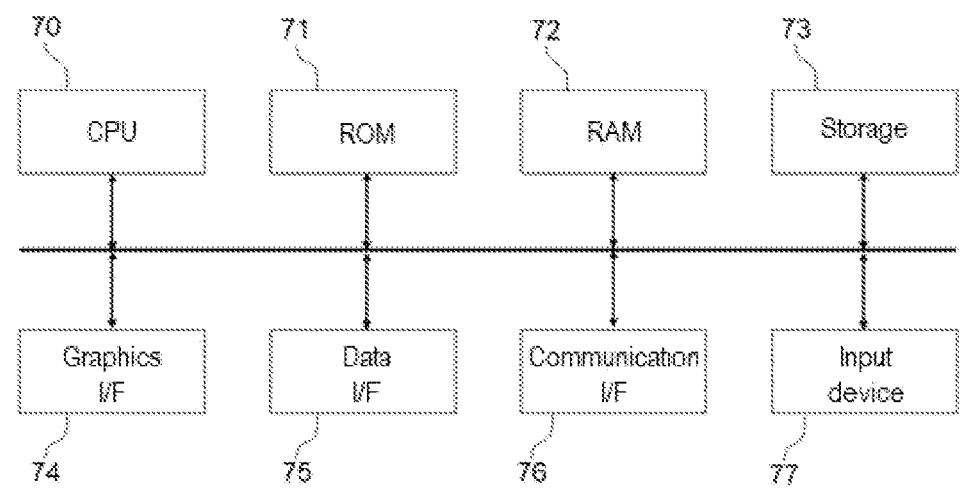
FIG. 10 is a block diagram explaining the hardware constitution of an exemplary information processing device.

The information processing device 2 can be constituted by a computer, a server device, and the like. FIG. 10 is a diagram showing an example of the hardware constitution of the information processing device 2. The information processing device 2 has CPU 70, ROM 71, RAM 72, storage 73, graphics I/F 74, data I/F 75, communication I/F 76, and input device 77, each of which is connected to the bus.

The storage 73 is a storage medium capable of storing data non-volatilely. For example, a hard disk drive, a flash memory can be used. The CPU 70 is a processor that executes processing in accordance with a program stored in the ROM 71 and the storage 73 by using the RAM 72 as a work memory. The graphics I/F 74 is an interface that converts generated display control signals into signals that can be displayed by the device and outputs the signals.

The data I/F 75 is an interface for inputting data from the outside. For example, an interface such as USB can be applied. The communication I/F 76 is an interface for communicating with a network using a predetermined protocol. The input device 77 receives user input and outputs predetermined control signals.

In the toning control system, the information processing device 2 has a dimming determination unit 3 that determines a control command for adjusting illumination light emitted by the light emitting device 1. The dimming determination unit 3 determines the light emission ratio for emitting a plurality of single lights from the light emitting device 1 when controlling the correlated color temperature in the range from the first value to the second value.

The information processing device 2 also has a transmission unit 4 that transmits a control command for instructing light emission at a determined light emission ratio. The light emitting device 1 emits illumination based on the control command received from the information processing device 2.

In order to perform toning in accordance with the circadian rhythm, the toning is preferably performed corresponding to the change in the color temperature of sunlight. However, the toning may not be accurately performed according to the change of sunlight. For example, the correlated color temperature is linearly increased from 4,000 K to 6,500 K during 6:00 to 10:00 in a day to reach 6,500 K at 10:00. Thereafter, the correlated color temperature is maintained at 6,500 K until 14:30, and linearly decreased from 6,500 K to 4,000 K during 14:30 to 17:00. The correlated color temperature is further decreased from 4,000 K to 2,700 K during 17:00 to 19:00.

As described above, the light emitting device 1 according to the exemplary embodiment is able to emit a light having a high color rendering index R9, that is, an emitting light having high color rendering properties in the red region. The emitting light having excellent red reproducibility can be thus utilized for lighting such as illumination and displays, thereby improving user visibility.

Since the light emitting device 1 has an excellent melanopic ratio, it is also possible to consider the circadian rhythm of users. The light emitting device 1 is able to suppress variations in the value of the color rendering index R9 and maintain a good value even in toning control where the value of the melanopic ratio increases or decreases, and thus a light emitting device in consideration of circadian rhythm and color rendering properties can be realized.

Although the embodiments according to the present disclosure have been described above, the technical idea of the present disclosure is not limited to the specific embodiments described. The present disclosure can be applied without necessarily and sufficiently providing all the constituent elements disclosed by the embodiments. Even if a part of the constituent elements disclosed by the embodiments is not described in the scope of the claims, the present disclosure is applicable as long as it is within the flexibility of design to a person skilled in the art or in the technical field of the present disclosure, and thus the present disclosure is disclosed on the assumption that the present specification encompasses such constituent elements.

The light emitting device or toning control system according to the embodiment can be used in the fields of illumination and displays. It can also be used for electronic signboards and electronic advertisements. Further, it can also be used for information processing terminals that display augmented reality, virtual 3D space.

The invention claimed is:

1. A light emitting device,
comprising one or more light emitting elements, at least one first fluorescent material, at least one second fluorescent material containing at least a fluorescent material different from the at least one first fluorescent material, and at least one third fluorescent material containing at least a fluorescent material different from the at least one first fluorescent material and the at least one second fluorescent material; and emitting a first light from at least one of the one or more light emitting elements and the at least one first fluorescent material, a second light from at least one of the one or more light emitting elements and the at least one second fluorescent material, and a third light from at least one of the one or more light emitting elements and the at least one third fluorescent material, wherein the first light has a first color temperature with a correlated color temperature in a range of 1,500 K or more and 3,500 K or less, and has a color rendering index R9 of 50 or more, the second light has a second color temperature with a correlated color temperature in a range of 3,500 K or more and 5,500 K or less, wherein the second color temperature is higher than the first color temperature, and has a color rendering index R9 of 50 or more, the third light has values of X and Y coordinates in the chromaticity diagram of the CIE1931 color system that are smaller than the values of X and Y coordinates at a color temperature of 5,500 K on the black body radiation locus, and a light having a correlated color temperature of 6,500 K composed of two or more lights including at least the third light among the first light, the second light, and the third light, has a color rendering index R9 of 50 or more and a melanopic ratio of 1.0 or more, provided that the light excludes a two lights form consisting only of the first light and the third light.

2. The light emitting device according to claim 1, wherein the light having a correlated color temperature of 6,500 K composed of two or more lights including at least the third light among the first light, the second light, and the third light, has a color rendering index R15 of 85 or more.

3. The light emitting device according to claim 1, wherein a light having a correlated color temperature in a range of 3,500 K or more and 5,500 K or less composed of one or more lights among the first light, the second light, and the third light, has a color rendering index R9 of 60 or more.

4. The light emitting device according to claim 1,
wherein the first color temperature has a correlated color temperature in a range of 1,500 K or more and 2,700 K or less, and a light having a correlated color temperature in a range of 2,700 K or more and 6,500 K or less composed of one or more lights among the first light, the second light, and the third light, has an average color rendering index Ra of 80 or more.

5. The light emitting device according to claim 4, wherein the light having a correlated color temperature in a range of 2,700 K or more and 6,500 K or less composed of one or more lights among the first light, the second light, and the third light, has a melanopic ratio that monotonically increases as the correlated color temperature increases.

6. The light emitting device according to claim 1, wherein the third light has a color rendering index R9 of less than 30.

7. The light emitting device according to claim 1, wherein the one or more light emitting elements for the first light include light emitting elements having an emission peak in a range of 410 nm or more and 490 nm or less, and the at least one first fluorescent material for the first light includes a fluoride fluorescent material having a composition represented by the formula $K_2SiF_6:Mn^{4+}$ and having a light emission peak in the vicinity of 630 nm.

8. The light emitting device according to claim 7, wherein the one or more light emitting elements for the second light include light emitting elements having an emission peak in a range of 410 nm or more and 490 nm or less, and the at least one second fluorescent material for the second light includes a fluoride fluorescent material having a composition represented by the formula $K_2SiF_6:Mn^{4+}$ and having a light emission peak in the vicinity of 630 nm.

9. The light emitting device according to claim 8, wherein the second light having a light emission peak in the vicinity of 630 nm.

10. The light emitting device according to claim 1, wherein the first light having a light emission peak in the vicinity of 630 nm.

11. The light emitting device according to claim 1, wherein the one or more light emitting elements for the second light include light emitting elements having an emission peak in a range of 410 nm or more and 490 nm or less, and the at least one second fluorescent material for the second light includes a fluoride fluorescent material having a composition represented by the formula $K_2SiF_6:Mn^{4+}$ and having a light emission peak in the vicinity of 630 nm.

12. The light emitting device according to claim 1, wherein the third light has an MR value in a range of 1.80 or more and 3.00 or less.

* * * * *